United States Patent
Oh

[11] Patent Number: 6,108,248
[45] Date of Patent: Aug. 22, 2000

[54] COLUMN ADDRESS STROBE SIGNAL GENERATOR FOR SYNCHRONOUS DYNAMIC RANDOM ACCESS MEMORY

[75] Inventor: Jong Hoon Oh, Seoul, Rep. of Korea

[73] Assignee: Hyundai Electronics Industries Co., Ltd., Ichon, Rep. of Korea

[21] Appl. No.: 08/828,494

[22] Filed: Apr. 4, 1997

[30] Foreign Application Priority Data

Apr. 4, 1996 [KR] Rep. of Korea ................ 96/10214

[51] Int. Cl.[7] ................................................. G11C 7/00
[52] U.S. Cl. ..................................... 365/193; 365/230.03
[58] Field of Search ................................... 365/193, 233, 365/230.03, 203, 222, 201

[56] References Cited

U.S. PATENT DOCUMENTS

| | | | |
|---|---|---|---|
| 5,471,430 | 11/1995 | Sawada et al. | 365/222 |
| 5,583,823 | 12/1996 | Park | 365/193 |
| 5,652,856 | 7/1997 | Santeler et al. | 365/193 |
| 5,895,481 | 4/1999 | Yap | 365/193 |
| 5,926,827 | 7/1999 | Dell et al. | 365/193 |

FOREIGN PATENT DOCUMENTS 55-163686   11/1980   Japan .
8-087883    4/1996    Japan .

*Primary Examiner*—Son T. Dinh
*Attorney, Agent, or Firm*—Thelen Reid & Priest, LLP

[57] ABSTRACT

A column address strobe signal generator for a synchronous dynamic random access memory with at least two internal banks, comprising a column address strobe signal active input stage for allowing a column address strobe signal to enter an active state, a column address strobe signal precharge input stage for allowing the column address strobe signal to enter a precharge state, and a bank select address input stage for selecting an external bank select address signal when a test mode signal is at an inactive state and an internal bank select address signal from a refresh counter when the test mode signal is at an active state, to allow a bank specified by the column address strobe signal to be the same as that specified by a row address strobe signal in a test mode where the refresh counter is tested, the internal bank select address signal being one of row addresses from the refresh counter. According to the present invention, the column address strobe signal generator can solve discordance between bank select addresses when the row address strobe signal and column address strobe signal are generated in the test mode operation of the SDRAM.

2 Claims, 6 Drawing Sheets

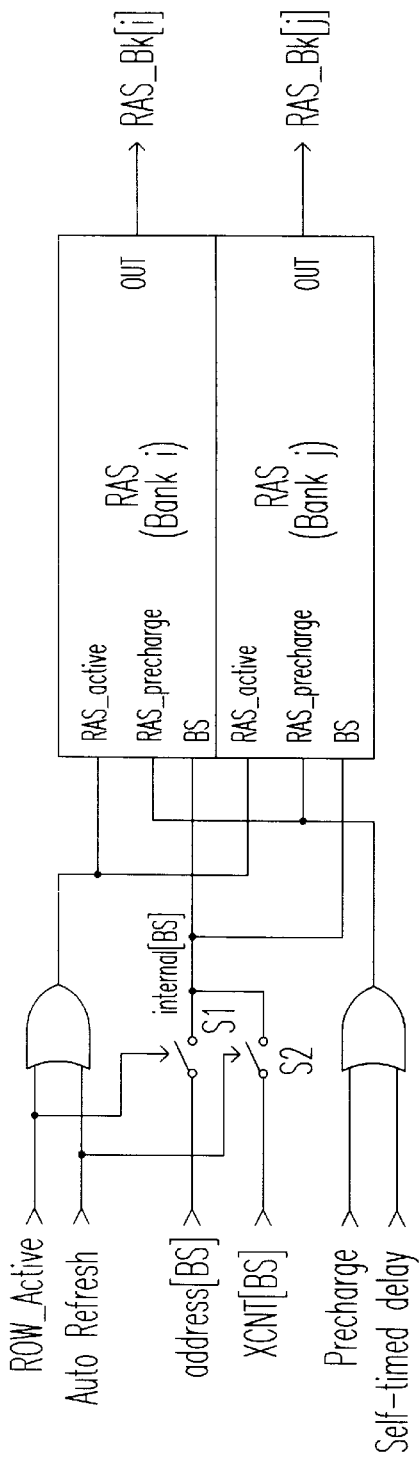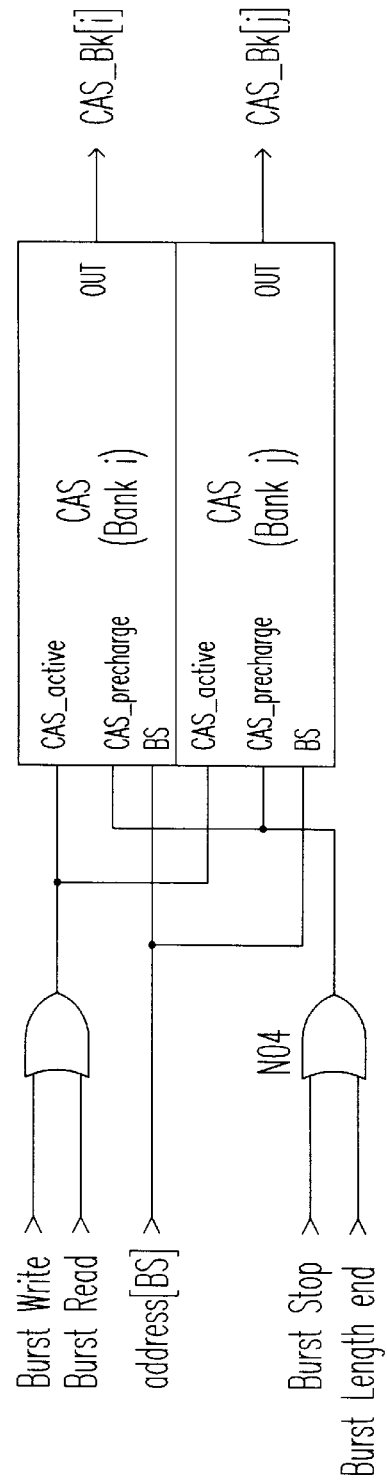

COLUMN ADDRESS STROBE SIGNAL GENERATOR FOR SYNCHRONOUS DYNAMIC RANDOM ACCESS MEMORY

BACKGROUND OF THE INVENTION

1. Field of the Invention

The present invention relates in general to a synchronous dynamic random access memory (referred to hereinafter as SDRAM), and more particularly to a column address strobe (referred to hereinafter as CAS) signal generator for an SDRAM with at least two banks, which is capable of solving discordance between bank select addresses when a row address strobe (referred to hereinafter as RAS) signal and a CAS signal are generated in a test mode operation of the SDRAM.

2. Description of the Prior Art

Generally, an automatic refresh operation of an SDRAM is the same as a CAS-before-RAS (CBR) refresh operation of a DRAM. The automatic refresh operation is to input a row address from a refresh counter in the chip and advance a refresh cycle in response to the input row address.

The automatic refresh operation of the SDRAM has the following characteristics.

The automatic refresh operation is a self-timed RAS signal manner in which a RAS signal of a bank corresponding to a bank select address BS is driven after an automatic refresh command Auto Ref is applied, and then automatically returned to a precharge state after the lapse of a predetermined delay time. An automatic refresh exit command is not necessary.

The bank select address BS which is a least significant bit LSB of a refresh counter is toggled in each automatic refresh cycle (for example, in the case where the refresh counter provides its output signals up to A11 (bank select address BS) when a 16 M SDRAM has a 4 k cycle).

For a better understanding of the specification, the meaning of signals related to a general SDRAM will hereinafter be described.

The "CLK" signifies a system clock pin. In the SDRAM, all command operations are advanced synchronously with a system clock.

The "Bank" signifies each of the memory areas with different address fields. The banks have individually operable peripheral circuits, respectively. One bank performs a command, while simultaneously other banks selectively perform different commands.

The "command" signifies a command signal determined by the combination of signals /CS, /RAS, /CAS and /We.

The "Auto Refresh" signifies an automatic refresh command signal analogous to a CAS-before-RAS refresh in a conventional DRAM.

The "xcnt[0:n]" signifies output signals from the refresh counter corresponding to row addresses of 0 to n.

The "xcnt[BS]" signifies an output signal from the refresh counter corresponding to the bank select address BS. In the SDRAM, the signal xcnt[BS] corresponds to a least significant bit LSB of the refresh counter.

The "xcntinc" signifies a sequentially increased signal from the refresh counter. The signal xcntinc is generated in each automatic refresh cycle.

The "RAS_Bk[0:1]" signifies a RAS signal corresponding to a bank 0 or bank 1. Namely, the RAS signal RAS_Bk[0:1] controls both bank 0 and bank 1 in the 16 M SDRAM with the two banks. Similar to an output signal from a conventional row address strobe bar (/RAS) input buffer, the RAS signal RAS_Bk[0:1] starts a row cycle, drives a selected word line and enables a bit line sensing operation.

The "MRS" signifies a mode register set command signal. In other words, the signal MRS means a cycle for programming the status of a mode register required in the SDRAM.

The "test mode" is an OP-code corresponding to a seventh bit of the mode register. If the OP-code is set to "H", the present mode is set to a test mode to enter a refresh counter test cycle.

The "WT" or "RD" signifies a burst write or read command signal. A burst mode is advanced by the number of clocks corresponding to a burst length programmed in the mode register.

The "Bk[i], [j]" indicates the status of one of a plurality of banks.

The "tRCD" signifies the time required from a RAS signal active point to a burst command point.

The "tRP" signifies a minimum RAS signal precharge time.

The "PCG_All (precharge all banks)" signifies a signal for allowing all banks in the SDRAM to enter a precharge state at the same time.

The "tRRD" signifies the minimum time required from a RAS signal active point to the subsequent RAS signal active point, namely, a RAS signal active time difference between the successive banks.

The "BS" signifies an external bank select address input signal ("ADDRESS[BS]" in the drawing).

The "YA" signifies a column address where the burst mode is advanced. It is common that the column address YA is fixed to a desired value in the general test mode.

The automatic refresh and test mode operations of the conventional SDRAM will hereinafter be described with reference to FIGS. 1 to 4.

FIG. 1 is a block diagram illustrating the construction of a conventional refresh counter for an SDRAM. As shown in this drawing, the refresh counter includes a first counter circuit 11 for generating a bank select address signal xcnt [BS] of a least significant bit in response to an address signal xcntinc which is generated in each automatic refresh cycle. The bank select address signal xcnt[BS] is toggled in each automatic refresh cycle. The refresh counter further includes n counter circuits connected in series to the first counter circuit 11, for generating address signals corresponding to row addresses.

FIGS. 2a to 2g are timing diagrams illustrating an automatic refresh operation of the conventional refresh counter in FIG. 1 based on an automatic refresh command signal. The automatic refresh command signal is generated as shown in FIG. 2b by the combination of a chip select signal /CS, a row address strobe bar signal /RAS, a column address strobe bar signal /CAS and a write enable signal /We. Upon receiving the automatic refresh command signal, the first counter circuit 11 in the refresh counter in FIG. 1 generates the bank select address signal xcnt[BS] which is toggled in each automatic refresh cycle, as shown in FIG. 2d. A RAS signal RAS_Bk1 corresponding to a bank 1 goes from low to high in logic, as shown in FIG. 2f, in response to the first automatic refresh command signal. The RAS signal RAS_Bk1 remains at a high logic state for a predetermined time period. Then, a RAS signal RAS_Bk0 corresponding to a bank 0 goes from low to high in logic, as shown in FIG. 2g, in response to the second automatic refresh command signal.

The RAS signal RAS_Bk0 remains at a high logic state for a predetermined time period.

FIG. 3A is a view illustrating the construction of a conventional RAS signal generator for the SDRAM. The RAS signal generator is adapted to generate RAS signals RAS_BK[i] and RAS_BK[j] for adjusting a row cycle. To this end, the RAS signal generator includes a RAS_active input stage for allowing the RAS signal to enter an active state, a RAS precharge input stage for allowing the RAS signal to enter a precharge state, and a BS input stage being driven upon inputting a specified bank select address.

The RAS_active input stage is driven in response to a command signal ROW_active or an automatic refresh command signal to allow the RAS signal to rise from low to high in logic.

The RAS_precharge input stage is driven in response to a precharge command signal or a self-timed delay signal to allow the RAS signal to fall from high to low in logic. However, in the test mode, the RAS precharge input stage is driven in response to the precharge command signal even in the automatic refresh command cycle to allow the RAS signal to go from high to low in logic. The self-timed delay signal is automatically generated in the chip after a bit line sensing operation is completed in the refresh cycle.

The BS input stage inputs an external bank select address signal ADDRESS[BS] in the normal state where the operation is performed in response to the command signal ROW_active. Also, the BS input stage inputs the bank select address signal xcnt[BS] from the refresh counter in the automatic refresh command mode (or the test mode).

Further, the BS input stage is driven upon inputting a specified bank select address. As a result, even in the case where the RAS_precharge input stage is driven, the RAS signal generator is suppressed in operation if the input signal is not a specified bank select address.

FIG. 3B is a view illustrating the construction of a conventional CAS signal generator for the SDRAM. The CAS signal generator is adapted to generate CAS signals CAS_BK[i] and CAS_BK[j] for adjusting a write or read column cycle. To this end, the CAS signal generator includes a CAS_active input stage for allowing the CAS signal to enter an active state, a CAS_precharge input stage for allowing the CAS signal to enter a precharge state, and a BS input stage being driven upon inputting a specified bank select address.

The CAS_active input stage is driven in response to a burst write command signal or a burst read command signal to allow the CAS signal to go from low to high in logic.

The CAS_precharge input stage is driven in response to a burst length end signal or a burst stop signal to allow the CAS signal to go from high to low in logic. The burst length end signal is automatically generated when the present burst length satisfies a burst length of a specified burst command. The burst stop signal is generated in the middle of the burst command operation.

The BS input stage is adapted to input a specified bank select address. As a result, even in the case where the CAS_active or CAS_precharge input stage is driven, the CAS signal generator is suppressed in operation if the input signal is not a specified bank select address.

FIGS. 4a to 4i are timing diagrams illustrating a test mode cycle operation of the conventional refresh counter in FIG. 1 based on the output signals from the conventional RAS and CAS signal generators in FIGS. 3A and 3B. The refresh counter enters the test mode in response to a mode register set command signal and the associated OP-code (test mode select bit). At this time, the self-timed RAS function is blocked differently from the normal automatic refresh operation. As a result, the RAS signal is returned to the precharge state in response to an external precharge command (herein, PCG_All for allowing all the banks in the SDRAM to enter the precharge state at the same time) after the burst write or read cycle is advanced.

Noticeably, in contrast to the DRAM, the SDRAM must input the bank select address BS for selecting the corresponding one of multiple banks in the chip in the burst command mode corresponding to the column cycle. To this end, conventionally, the external bank select address signal ADDRESS[BS] is applied to the BS input stage of the CAS signal generator.

However, the bank select address signal xcnt[BS] from the internal refresh counter is supplied to the BS input stage in the automatic refresh command mode (for addressing, for example, the bank Bank [i]), and the CAS signal corresponding to the external bank select address signal ADDRESS[BS] is made active in the burst command mode (for addressing, for example, the bank Bank[j]) For this reason, if the bank select address signals xcnt [BS] and ADDRESS [BS] are different from each other, a desired burst write or read operation cannot be performed.

SUMMARY OF THE INVENTION

The present invention has been made in view of the above problem, and it is an objective of the present invention to provide a CAS signal generator for SDRAM with at least two banks, which is capable of solving discordance between bank select addresses when a RAS signal and a CAS signal are generated in a test mode operation of the SDRAM.

In accordance with the present invention, the above and other objectives can be accomplished by a provision of a column address strobe signal generator for a synchronous dynamic random access memory with at least two internal banks, comprising column address strobe signal active input means for allowing a column address strobe signal to enter an active state; column address strobe signal precharge input means for allowing the column address strobe signal to enter a precharge state; and bank select address input means for selecting an external bank select address signal when a test mode signal is at an inactive state and an internal bank select address signal from a refresh counter when the test mode signal is at an active state, to allow a bank specified by the column address strobe signal to be the same as that specified by a row address strobe signal in a test mode where the refresh counter is tested, the internal bank select address signal being one of row addresses from the refresh counter.

BRIEF DESCRIPTION OF THE DRAWINGS

The above and other objectives, features and advantages of the present invention will be more clearly understood from the following detailed description taken in conjunction with the accompanying drawings, in which:

FIG. 3A is a view illustrating the construction of a conventional RAS signal generator for the SDRAM;

FIG. 3B is a view illustrating the construction of a conventional CAS signal generator for the SDRAM;

DETAILED DESCRIPTION OF THE PREFERRED EMBODIMENTS

Figure 5A:
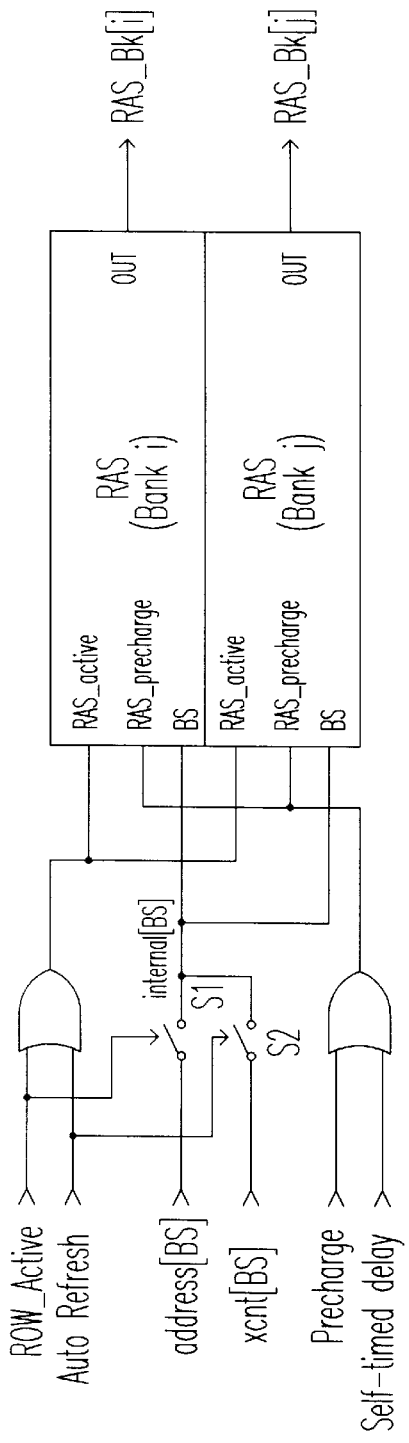
FIG. 5A is a view illustrating the construction of a RAS signal generator for an SDRAM in accordance with the present invention.

FIG. 5A is a view illustrating the construction of a RAS signal generator for SDRAM in accordance with the present invention. The RAS signal generator in this drawing is the same in construction and operation as that in FIG. 3A and a description thereof will thus be omitted.

Figure 5B:
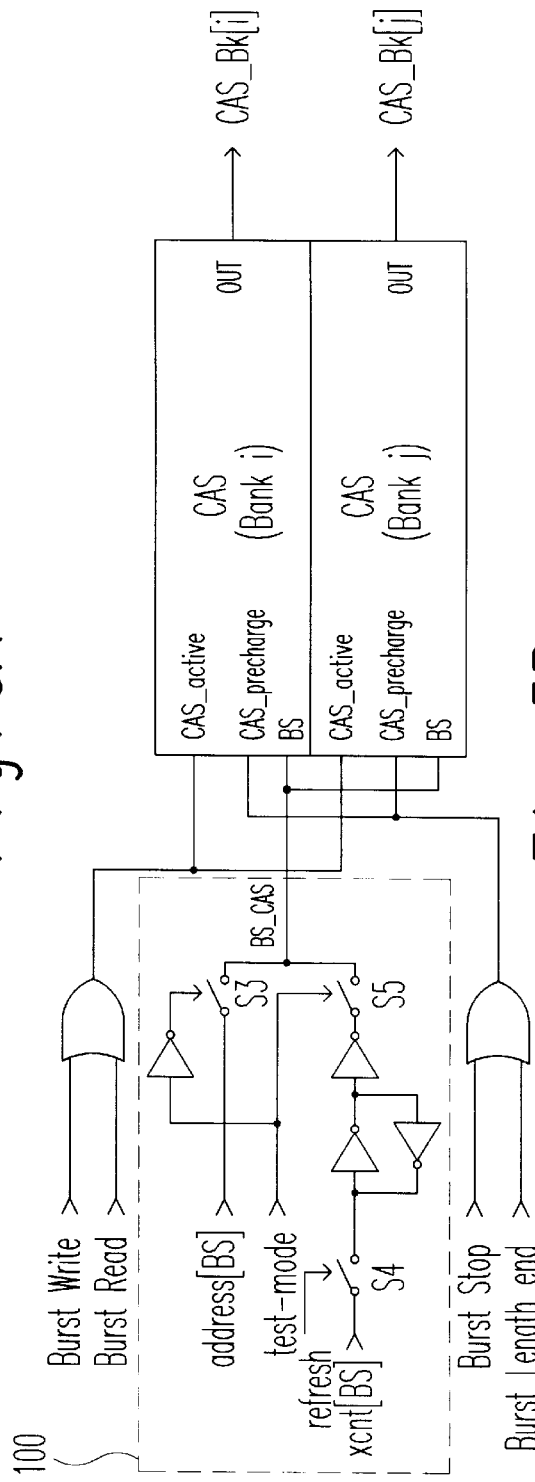
FIG. 5B is a view illustrating the construction of a CAS signal generator for the SDRAM in accordance with the present invention.
Figure 6:
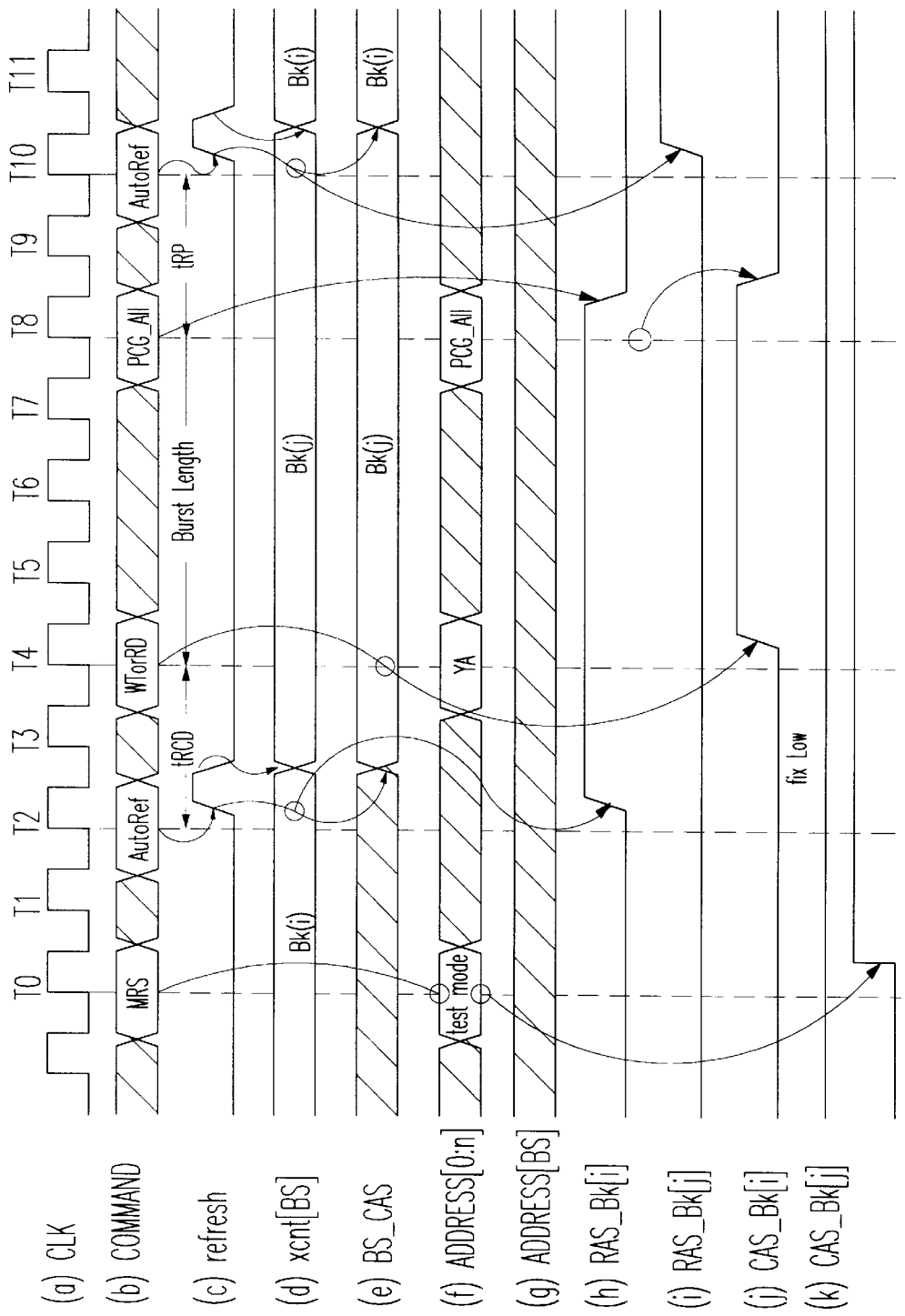
FIGS. 6a to 6k are timing diagrams illustrating a test mode cycle operation of the conventional refresh counter in FIG. 1 based on output signals from the RAS and CAS signal generators in FIGS. 5A and 5B.

FIG. 5B is a view illustrating the construction of a CAS signal generator for the SDRAM in accordance with the present invention. The CAS signal generator is adapted to generate CAS signals CAS_BK[i] and CAS_BK[j] for adjusting a write or read column cycle. To this end, the CAS signal generator includes a CAS_active input stage for allowing the CAS signal to enter an active state, a CAS_precharge input stage for allowing the CAS signal to enter a precharge state, and a BS input stage 100 being driven upon inputting a specified bank select address.

The CAS_active and CAS recharge input stages in FIG. 5B are the same in construction and operation as those in FIG. 3B and a description thereof will thus be omitted. As a result, only the construction and operation of the BS input stage 100 will hereinafter be described in detail in accordance with the preferred embodiment of the present invention.

Figure 1:
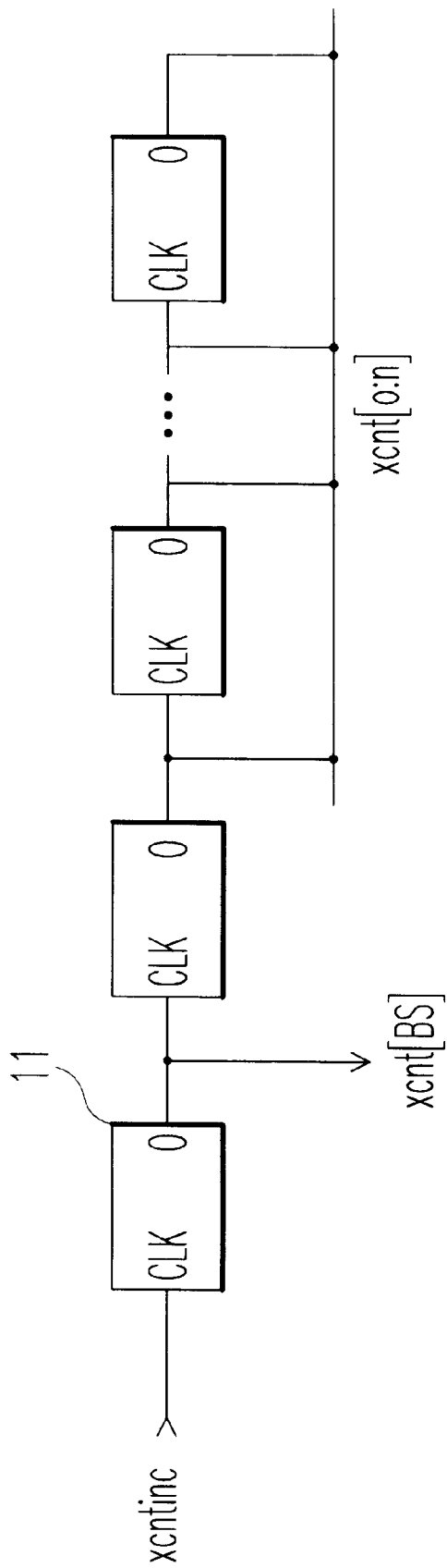
FIG. 1 is a block diagram illustrating the construction of a conventional refresh counter for an SDRAM.
Figure 2:
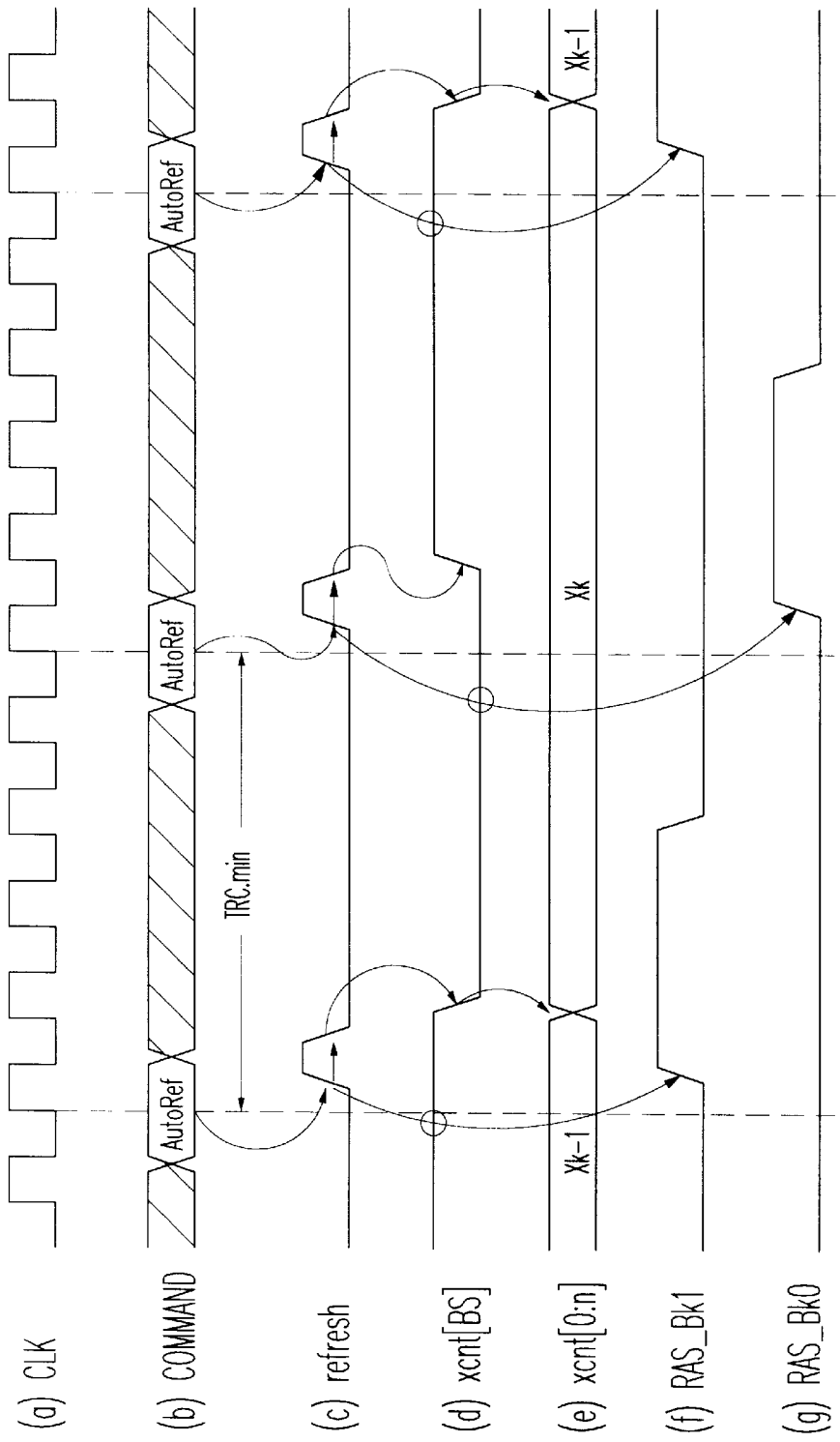
FIGS. 2a to 2g are timing diagrams illustrating an automatic refresh operation of the conventional refresh counter in FIG. 1 based on an automatic refresh command signal.
Figure 4:
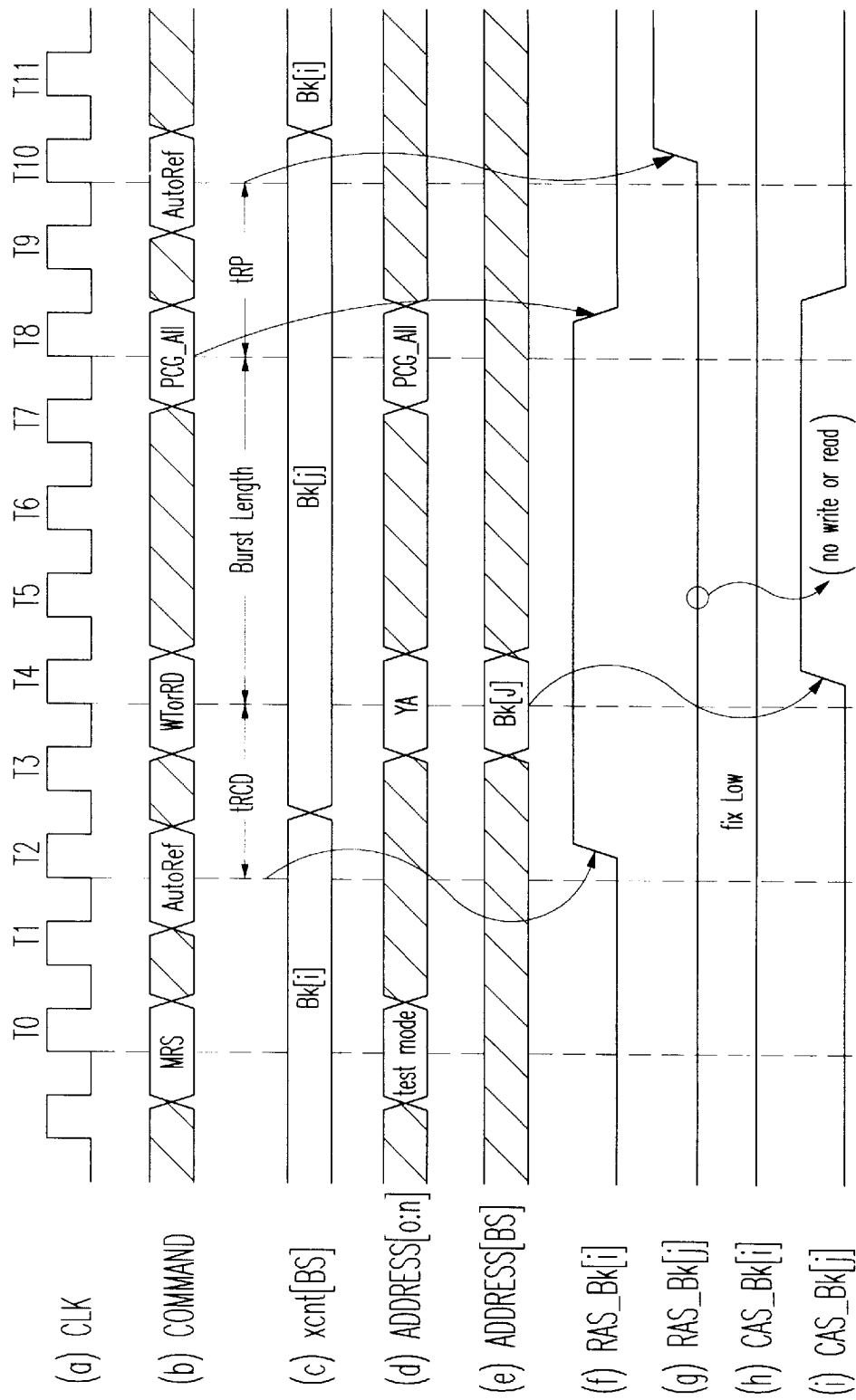
FIGS. 4a to 4i are timing diagrams illustrating a test mode cycle operation of the conventional refresh counter in FIG. 1 based on output signals from the conventional RAS and CAS signal generators in FIGS. 3A and 3B.

The BS input stage 100 is provided with a multiplex circuit for selectively inputting the external bank select address signal ADDRESS[BS] and the internal bank select address signal xcnt[BS] from the refresh counter in FIG. 1. The multiplex circuit includes a first transfer switch S3 for selecting the external bank select address signal ADDRESS [BS] when a test mode signal test_mode is at an inactive state (for example, low logic state), and a second transfer switch S5 for selecting the internal bank select address signal xcnt [BS] from the refresh counter when the test mode signal test_mode is at an active state (for example, high logic state). The test mode signal test mode is enabled in a test mode, and the internal bank select address signal xcnt [BS] selected by the second transfer switch S5 is a corresponding register output of the row addresses from the refresh counter.

Output terminals of the first and second transfer switches S3 and S5 are connected in common to a BS input terminal of the CAS signal generator corresponding to each bank.

The operation of the CAS signal generator with the above-mentioned construction in accordance with the present invention will hereinafter be described in detail with reference to FIGS. 6a to 6k.

FIGS. 6a to 6k are timing diagrams illustrating a test mode cycle operation of the conventional refresh counter in FIG. 1 based on the output signals from the RAS and CAS signal generators in FIGS. 5A and 5B.

Programmed in the mode register in the SDRAM are a burst length (for example, 1, 2, 4, 8, . . . ,) defining the number of successive clocks in the burst mode, a counter type in the burst mode, a CAS length (for example, 1, 2, 3, 4, . . . ,) defining the number of clocks delayed from the input of a burst read command till the placing of first data on a DQ pin, and an OP-code specifying the test mode for testing the normal operation state of the refresh counter. The mode register set command MRS must be executed at time T0 to change the program contents in the mode register. The OP-code can be inputted through address input pins address [0:n].

If the OP-code specifies the test mode at the time T0 to allow the present mode to enter the test mode, the test mode signal test_mode is enabled from low to high in logic, thereby causing the first transfer switch S3 in the BS input stage 100 of the CAS signal generator to be turned off and the second transfer switch S5 in the BS input stage 100 to be turned on. As a result, the second transfer switch S5 transfers the internal bank select address signal xcnt[BS] to the BS input terminal of the CAS generator.

If the automatic refresh command signal AutoRef is applied at time T2, a refresh pulse signal in the chip is made active, thereby making a RAS signal (for example, RAS_Bk[i]) of a bank corresponding to the bank select address signal xcnt[BS] active. Also, in response to the active refresh pulse signal, the bank select address signal xcnt[BS] is written in a register in the BS input stage 100 of the CAS signal generator.

In the case where the refresh pulse signal is disabled from high to low in logic, the refresh counter performs the -counting operation in response to the address signal xcntinc for the execution of the subsequent automatic refresh command. The provision of the xcnt[BS] input register in the BS input stage 100 of the CAS signal generator is for holding the bank selection by the RAS signal generator based on the bank select address signal xcnt[BS] when the counted result from the refresh counter is transferred to the BS input stage 100 of the CAS signal generator.

In the case where the burst write or read command signal WT or RD is applied at time T4, the external bank select address signal ADDRESS[BS] becomes a don't care state, and the bank select address signal xcnt [BS] corresponding to the preceding RAS signal is transferred to the BS input stage 100 of the CAS signal generator through the xcnt [BS] input register. This can solve the problem of "discordance between bank select addresses" in the conventional CAS operation depending on the external input.

As is apparent from the above description, according to the present invention, the CAS signal generator can solve discordance between bank select addresses when the RAS signal and CAS signal are generated in the test mode operation of the SDRAM with at least two banks. Therefore, the present invention has the effect of simply performing the test mode function of the refresh counter.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A column address strobe signal generator for a synchronous dynamic random access memory with at least two internal banks, comprising:

column address strobe signal active input means for allowing a column address strobe signal to enter an active state;

column address strobe signal precharge input means for allowing said column address strobe signal to enter a precharge state; and bank select address input means for selecting an external bank select address signal when a test mode signal is at an inactive state and an internal bank select address signal from a refresh counter when said test mode signal is at an active state, to allow a bank specified by said column address strobe signal to be the same as that specified by a row address strobe signal in a test mode where said refresh counter is tested, said internal bank select address signal being one of row addresses from said refresh counter.

2. A column address strobe signal generator for a synchronous dynamic random access memory with at least two internal banks, as set forth in claim 1, wherein said internal bank select address signal holds an output value from said refresh counter corresponding to said bank specified by said row address strobe signal.

* * * * *